United States Patent
Choi et al.

(10) Patent No.: US 10,067,205 B2
(45) Date of Patent: Sep. 4, 2018

(54) ANALOG SIGNAL CORRECTING CIRCUIT IMPROVING SIGNAL DISTORTION DUE TO CABLE

(71) Applicant: INDUSTRY-UNIVERSITY COOPERATION FOUNDATION SOGANG UNIVERSITY, Mapo-gu, Seoul (KR)

(72) Inventors: Yong Choi, Seoul (KR); Jihoon Kang, Jeollanam-do (KR); Kyubom Kim, Gyeonggi-do (KR)

(73) Assignee: INDUSTRY-UNIVERSITY COOPERATION FOUNDATION SOGANG UNIVERSITY, Seoul (KR)

( * ) Notice: Subject to any disclaimer, the term of this patent is extended or adjusted under 35 U.S.C. 154(b) by 905 days.

(21) Appl. No.: 14/398,597

(22) PCT Filed: Dec. 5, 2012

(86) PCT No.: PCT/KR2012/010481
§ 371 (c)(1),
(2) Date: Dec. 8, 2014

(87) PCT Pub. No.: WO2013/165064
PCT Pub. Date: Nov. 7, 2013

(65) Prior Publication Data
US 2015/0108982 A1    Apr. 23, 2015

(30) Foreign Application Priority Data

May 3, 2012  (KR) .................. 10-2012-0046910
Nov. 23, 2012  (KR) .................. 10-2012-0133757

(51) Int. Cl.
G01R 33/48    (2006.01)
G01T 1/16    (2006.01)

(52) U.S. Cl.
CPC .......... G01R 33/481 (2013.01); G01T 1/1603 (2013.01)

(58) Field of Classification Search
CPC ...... G01T 1/1603; G01R 33/32; G01R 33/48; G01R 33/481; G01R 33/28; G01R 33/4808; G01R 33/30; G01R 33/34
See application file for complete search history.

(56) References Cited

U.S. PATENT DOCUMENTS

2006/0055455 A1    3/2006  Lee
2012/0007438 A1*   1/2012  Kuroda ............... H04L 25/0266
                                                         307/104
2012/0223715 A1    9/2012  Park et al.

FOREIGN PATENT DOCUMENTS

JP    2006-087112 A    3/2006
KR    10-1998-0022579 A    7/1998
(Continued)

*Primary Examiner* — David Porta
*Assistant Examiner* — Faye Boosalis
(74) *Attorney, Agent, or Firm* — Brinks Gilson & Lione

(57) ABSTRACT

A pulse restoration circuit includes: a voltage restorator configured to include an OP amplifier and input an input voltage to an input terminal of the OP amplifier; a rising time restorator configured to be connected to the other input terminal of the OP amplifier; and a falling time restorator configured to be connected to an output terminal of the OP amplifier, whereby it is possible to improve a reduction in performance of the medical image electronics transmitting an analog signal via the cable and a PET detector of a PET-MRI convergence system among the medical image electronics by correcting a distortion phenomenon of an output signal depending on a cable length into the original signal using the pulse restoration circuit.

6 Claims, 20 Drawing Sheets

(56) References Cited

FOREIGN PATENT DOCUMENTS

| KR | 20-0128668 Y1 | 11/1998 |
| KR | 100195281 B1 | 2/1999 |
| KR | 10-1999-0019293 A | 3/1999 |
| KR | 10-2012-0022356 A | 3/2012 |

* cited by examiner

ANALOG SIGNAL CORRECTING CIRCUIT IMPROVING SIGNAL DISTORTION DUE TO CABLE

CROSS-REFERENCE TO RELATED APPLICATION

This application is a nationalization of PCT Application No. PCT/KR2012/010481 filed on Dec. 5, 2012 and claims the benefit of priority to Korean Patent Application Nos. 10-2012-0046910 and 10-2012-0133757 filed on May 3, 2012 and Nov. 23, 2012 in the Korean Intellectual Property Office, the disclosure of which is incorporated herein in its entirety by reference.

TECHNICAL FIELD

The present disclosure relates to a pulse restoration circuit, and more particularly, to a pulse restoration circuit (PRC) capable of improving a reduction in performance in medical image electronics using a cable by correcting a distortion phenomenon of an output signal depending on a cable length into an original signal using the pulse restoration circuit and medical image electronics using the same.

BACKGROUND

Medical image electronics have used a transmission method using a cable to transmit a detected analog signal. However, an increase in a cable length is essentially involved for remote transmission, and therefore a distortion phenomenon of a detected analog output signal occurs and a reduction in performance occurs. To correct the occurrence of the reduction in performance, a method for amplifying a signal using a signal amplification circuit or a method for correcting a signal via an analog/digital converter by a digital signal processing unit has been used. A combination of positron emission tomography (PET) and magnetic resonance imaging (MRI) among medical image electronics may reduce a data acquisition time without additional radiographic exposure to provide in vivo biological information and simultaneously obtain functional and structural images. Thanks to these advantages, the importance of a PET-MRI convergence system is being emphasized. To increase compatibility of the MRI and the PET, a study on the PET-MRI convergence system using a semiconductor sensor as an alternative plan of a photomultiplier has been actively progressed.

Meanwhile, to design the PET-MRI convergence system, various signal transmission methods have been researched. First, a method for positioning only a scintillation crystal within an MR-bore and transmitting light from the scintillation crystal to the PMT via an optical fiber has a problem in that PET performance such as energy resolution and time resolution may be reduced and a volume of the optical fiber may be increased.

Second, there is a method for positioning a PET detection module, which is configured to include a scintillation crystal, a photo-sensor, and a preamplifier, within the MR-bore and transmitting an amplified signal from the preamplifier to the ADC via a voltage transmission cable. The method has a problem in that a space limitation may occur due to a front-end electronics positioned within the MR-bore, a shielding technology like shielding the PET detection module with copper to protect the PET detection module from a magnetic field may be required, and the reduction in the PET performance and the distortion of the MRI image may occur due to heat generated from the preamplifier.

SUMMARY

The present disclosure has been made to solve the above-mentioned problems occurring in the prior art while advantages achieved by the prior art are maintained intact.

An aspect of the present disclosure provides a pulse restoration circuit capable of improving performance of medical image electronics by reducing a distortion of an output signal depending on a cable length in the medical image electronics using the cable so as to correct the output signal into an original signal.

Another aspect of the present disclosure provides a PET-MRI convergence system capable of preventing PET performance from reducing due to a magnetic field within an MRI room since a PET electronics including a preamplifier is not positioned within the MRI room.

Still another aspect of the present disclosure provides a PET capable of improving a reduction in performance by reducing a distortion of an output signal depending on a cable length at the time of transmitting an analog signal using the cable in a PET detector.

Still yet another aspect of the present disclosure provides medical image electronics with improved performance by improving a distortion of an output signal depending on a cable length so as to correct the output signal into an original signal.

According to an exemplary embodiment of the present disclosure, a pulse restoration circuit, includes a voltage restorator configured to include an OP amplifier and input an input voltage to an input terminal of the OP amplifier; a rising time restorator configured to be connected to the other input terminal of the OP amplifier; and a falling time restorator configured to be connected to an output terminal of the OP amplifier.

The voltage restorator may include: an input resistor configured to be connected to the input terminal of the OP amplifier; an amplification terminal resistor connected to the rising time restorator in parallel configured to be connected to the other input terminal of the OP amplifier; and a feedback resistor configured to be connected between the other input terminal of the OP amplifier and an output terminal of the OP amplifier.

In the rising time restorator, a high pass filter resistor and a high pass filter capacitor may be connected in series between the other input terminal of the OP amplifier and a ground.

In the falling time restorator, an output terminal of the OP amplifier may be connected to one terminal of a low pass filter resistor, a low pass filter capacitor may be connected to the other terminal of the low pass filter resistor and a ground, one terminal of an output resistor may be connected to the other terminal of the low pass filter resistor, and a corrected output voltage may be output to the other terminal of the output resistor.

According to another exemplary embodiment of the present disclosure, a PET-MRI convergence system, includes: an MRI configured to include an MR bore disposed between an RF coil and a gradient coil; a PET detector configured to be inserted into the MR bore; a flexible flat cable configured to transmit a photo-sensor signal output from the PET detector to a pulse restoration circuit; a pulse restoration circuit configured to correct the photo-sensor signal passing through the flexible flat cable; and a data signal processing device configured to process the photo-sensor signal corrected by the pulse restoration circuit.

The MRI and the PET detector may be installed inside an MRI room and the pulse restoration circuit and the data signal processing device may be installed outside the MRI room.

The PET detector may be configured to include a scintillation crystal and a photo-sensor.

The pulse restoration circuit may include: a voltage restorator configured to include an OP amplifier and input an input voltage to an input terminal of the OP amplifier; a rising time restorator configured to be connected to the other input terminal of the OP amplifier; and a falling time restorator configured to be connected to an output terminal of the OP amplifier.

According to still another exemplary embodiment of the present disclosure, a PET, includes: a voltage restorator configured to include an OP amplifier and input an input voltage to an input terminal of the OP amplifier; a rising time restorator configured to be connected to the other input terminal of the OP amplifier; and a pulse restoration circuit configured to include a falling time restorator connected to an output terminal of the OP amplifier, wherein the pulse restoration circuit corrects an analog signal distorted by a cable.

According to still yet exemplary embodiment of the present disclosure, medical image electronics using a cable, includes: a voltage restorator configured to include an OP amplifier and input an input voltage to an input terminal of the OP amplifier; a rising time restorator configured to be connected to the other input terminal of the OP amplifier; and a pulse restoration circuit configured to include a falling time restorator connected to an output terminal of the OP amplifier, wherein the pulse restoration circuit corrects an analog signal distorted by a cable.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1A:
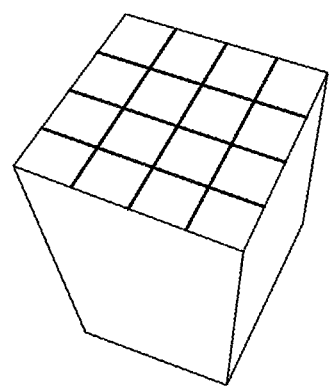
FIGS. 1A to 1C are diagrams illustrating a scintillation crystal (LYSO), a photo-sensor (GAPD), and flexible flat cables (FFCs) which are included in a PET detector according to an exemplary embodiment of the present disclosure.

To help understanding of the present disclosure, prior to describing the detailed contents of the present disclosure, an outline or a fundamental technical spirit of a solution of a problem to be solved by the present disclosure is first proposed.

A pulse restoration circuit capable of improving a signal distortion due to a cable connecting between PET and MRI according to an exemplary embodiment of the present disclosure includes an OP amplifier, a voltage restorator configured to input an input voltage to an input terminal of the OP amplifier, a rising time restorator configured to be connected to another input terminal of the OP amplifier, and a falling time restorator configured to be connected to an output terminal of the OP amplifier.

Hereinafter, exemplary embodiments of the present disclosure will be described in detail with reference to the accompanying drawings so that those skilled in the art may easily practice the present disclosure. However, the exemplary embodiments are to describe in detail the present disclosure and it will be apparent to those skilled in the art that the scope of the present disclosure is not limited to the exemplary embodiments.

Components of the present disclosure to elucidate solutions for the problems to be solved by the present disclosure will be described in detail with reference to the accompanying drawings based on the exemplary embodiments of the present disclosure. In attaching reference numerals to components of the drawings, the same components are denoted by the same reference numerals even though the components are present in other drawings and in describing the drawings, it will be appreciated that components of other drawings may be cited if necessary. Further, in describing in detail an operation principle of exemplary embodiments of the present disclosure, when a detailed description of well-known functions or components relating to the present disclosure and other matters may unnecessarily make unclear the spirit of the present disclosure, a detailed description thereof will be omitted.

In addition, throughout the specification, a case in which any one part is connected with the other part includes a case in which the parts are directly connected with each other and a case in which the parts are indirectly connected with each other with other elements interposed therebetween. In the specification, unless explicitly described to the contrary, a singular form includes a plural form in the present specification. "Comprises" or "comprising" used in the specification does not exclude the existence or addition of one or more other components, steps, operations or elements other than stated components, steps, operations, or elements.

The present disclosure relates to a pulse restoration circuit which may be used in medical image electronics transmitting an analog signal via a cable. Further, in a PET-MRI convergence system among the medical image electronics, the present disclosure relates to a pulse restoration circuit used to develop a PET detector which transmits a photo-sensor charge signal from the MRI to the PET electronics positioned at a remote distance. A pulse restoration circuit (PRC) is a circuit compensating for a reduction in performance which occurs due to a use of a long cable and a configuration of the PET detector included in the MRI will be first described.

Figure 1B:
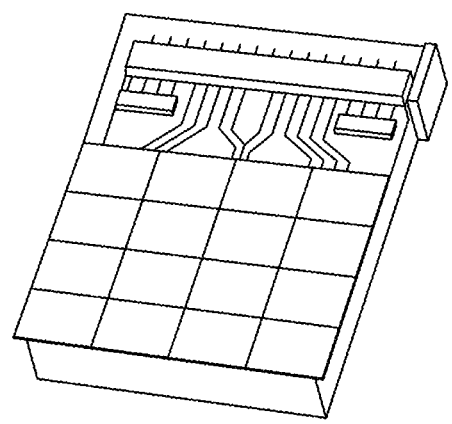
Figure 1C:
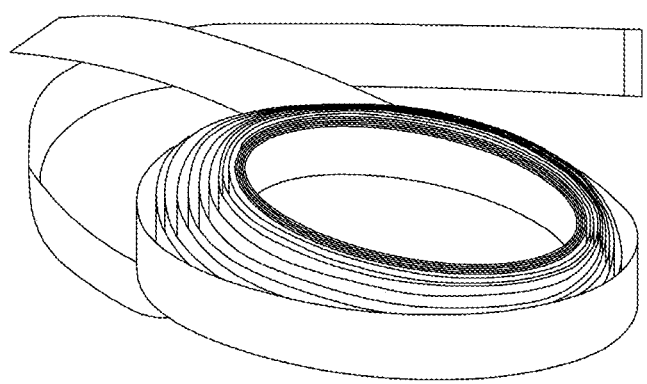

FIGS. 1A to 1C are diagrams illustrating a scintillation crystal (LYSO), a photo-sensor (GAPD), and flexible flat cables (FFCs) which are included in a PET detector according to an exemplary embodiment of the present disclosure. FIG. 1A illustrates an LYSO scintillation crystal configured in a 4×4 array having 3×3×20 mm$^3$, FIG. 1B illustrates a GAPD photo-sensor, and FIG. 1C illustrates a flexible flat cable.

A structure of the PET detector according to an exemplary embodiment of the present disclosure will be described with reference to FIGS. 1A to 1C.

The PET detector is configured to include an LYSO array and a GAPD array. The LYSO array and the GAPD array are configured to have 4×4 pixels in which pitches of 3.3 mm are arranged, but may be applied to a size of other pitches and pixel arrays.

A size of each of the scintillation crystals (LYSOs) is configured to have a 4×4 array having 3×3×20 mm$^3$ and each of the scintillation crystals is divided by white epoxy and each of the scintillation crystals (LYSOs) corresponds to each pixel of the photo-sensor (GAPD) one to one.

The flexible flat cables (FFCs) are used to transmit charge signals generated in the GAPD photo-sensor to the PET electronics positioned remotely. In this case, the PET electronics which include a preamplifier may be preferably installed outside an MRI room. The flexible flat cable which is configured of a ground-signal-ground line may reduce an increase in noise which may occur due to the long cable.

To improve compatibility of the PET-MRI convergence system according to the exemplary embodiment of the present disclosure, the PET-MRI convergence system transmits the photo-sensor charge signal to the preamplifier via the long cable. The method is a method for positioning a PET detector module, which is configured to include the scintillation crystal and the photo-sensor, within an MR-bore and then transmitting the photo-sensor charge signal to the preamplifier via the flexible flat cable. As a result, since a space occupied by the PET detector module within the MR-bore is reduced and unlike a coaxial cable or a twist flexible ribbon cable, a volume thereof is not large, the PET detector module may be configured to be slimmed by using a multi-channel PET output signal, and a reduction in the PET performance due to heat generated from the preamplifier does not occur. Meanwhile, a distortion phenomenon of an output pulse due to the long cable may occur, which may reduce the performance of the PET detector. Therefore, there is a need to compensate for the reduction in performance of the PET detector using the pulse restoration circuit.

Figure 2:
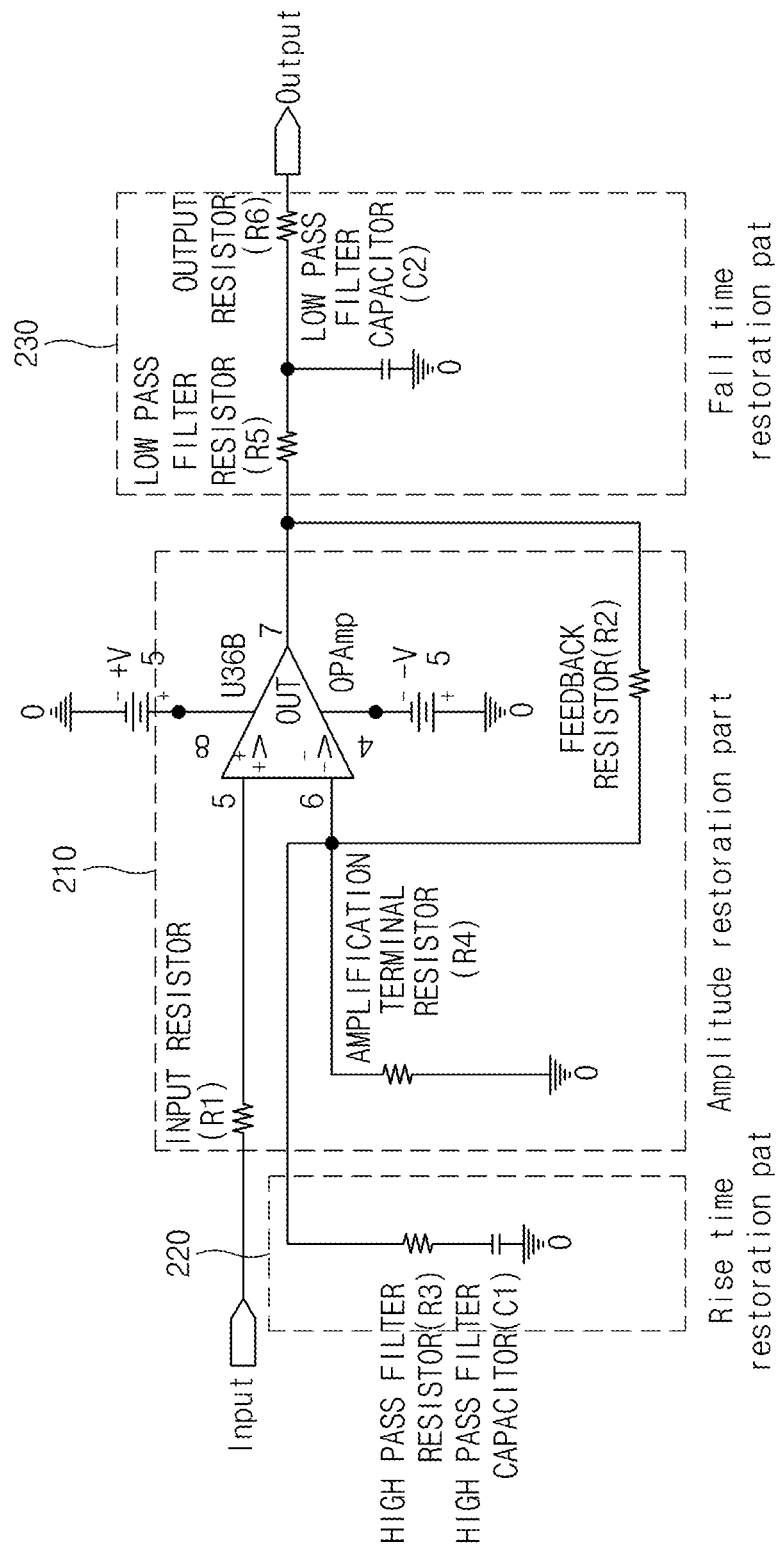
FIG. 2 is a diagram illustrating a pulse restoration circuit according to an exemplary embodiment of the present disclosure.

FIG. 2 is a diagram illustrating the pulse restoration circuit according to the exemplary embodiment of the present disclosure.

Referring to FIG. 2, the pulse restoration circuit according to the exemplary embodiment of the present disclosure is configured to include a voltage restorator 210, a rising time restorator 220, and a falling time restorator 230. The pulse restoration circuit according to the exemplary embodiment of the present disclosure is configured of a CR-RC shaping filter.

The CR-RC shaping filter is a band pass filter, in which a CR portion is configured to include a high pass filter resistor and a high pass filter capacitor and an RC portion is configured to include a low pass filter resistor and a low pass filter capacitor.

The voltage restorator 210 is configured to use an OP amplifier and resistors and an input voltage is input to any one input terminal +V of the OP amplifier.

Describing the voltage restorator 210, an input resistor R1 is connected to any one input terminal +V of the OP amplifier, an amplification terminal resistor R4 connected to the rising time restorator 220 in parallel is connected to the other input terminal −V of the OP amplifier, and a feedback resistor R2 is connected between the other input terminal of the OP amplifier and an output terminal of the OP amplifier.

The rising time restorator 220 is connected to the other input terminal of the OP amplifier.

The rising time restorator 220 includes a high pass filter resistor R3 and a high pass filter capacitor C1 which are connected in series between the other input terminal of the OP amplifier and a ground.

The falling time restorator 230 is connected to the output terminal of the OP amplifier.

In the falling time restorator 230, the output terminal of the OP amplifier is connected to one terminal of a low pass filter resistor R5, a low pass filter capacitor C2 is connected to the other terminal of the low pass filter resistor R5 and a ground, one terminal of an output resistor R6 is connected to the other terminal of the low pass filter resistor R5, and an output voltage which is a restoration voltage of the input voltage is output to the other terminal of the output resistor R6.

In this case, the rising time restorator 220 and the falling time restorator 230 are configured of a CR-RC shaping filter.

Hereinafter, the performance of the PET detector as a function of the cable length connected outside the MRI will be evaluated.

Figure 3:
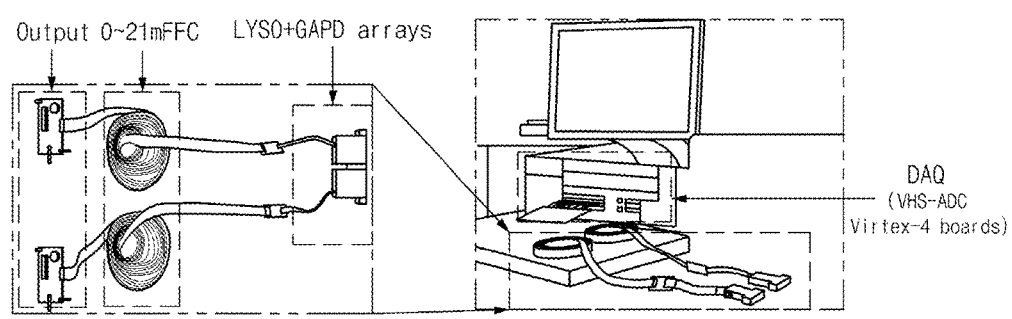
FIG. 3 is a diagram illustrating an experimental environment for investigating an effect of a cable length.

To evaluate the performance of the PET detector as the function of the cable length connected outside the MRI, an experimental environment as illustrated in FIG. 3 is established.

FIG. 3 is a diagram illustrating an experimental environment for investigating an effect of the cable length.

Referring to FIG. 3, a PET charge signal is transmitted to a DAQ apparatus via an FFC cable ranging from 0 m to 21 m.

An effect of the flexible flat cables (FFCs) on the performance of the PET detector depending on whether the pulse restoration circuit according to the exemplary embodiment of the present disclosure is present is investigated using eight FFCs having different lengths ranging from 0 m to 21 m.

A voltage magnitude, a rising time, and a falling time of an output from a GAPD photo-sensor are measured as the function of the cable length using an oscilloscope. A photopeak position, energy resolution, and time resolution are measured at a sampling frequency of 100 MHz using a data acquisition (DAQ) apparatus. In FIG. 3, the DAQ apparatus is represented by VHS-ADC Virtex4 boards.

Figure 4:
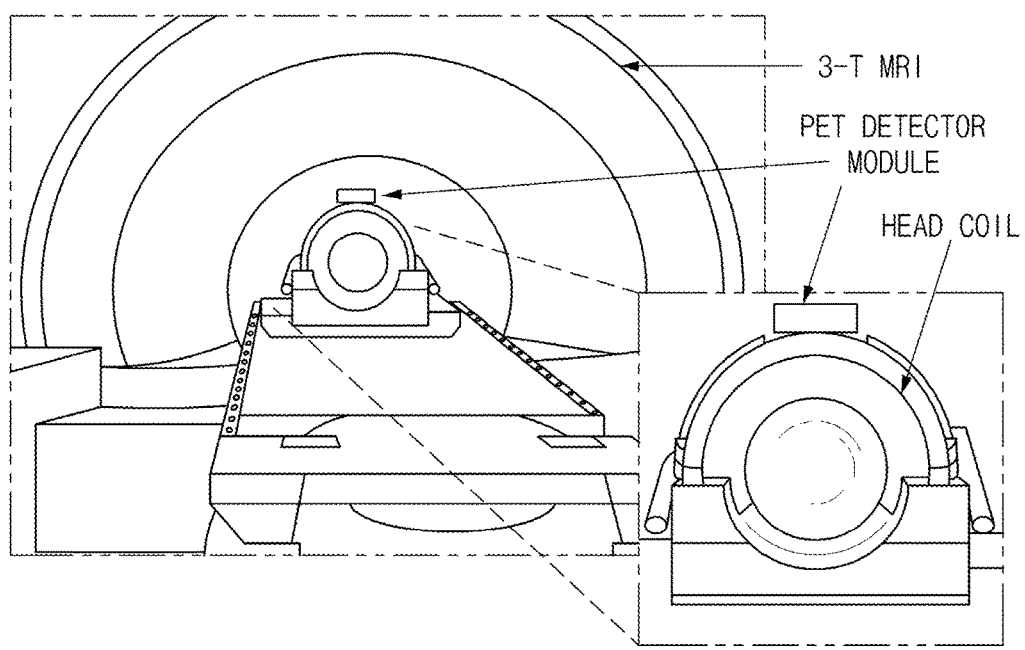
FIG. 4 is a diagram illustrating a 3-T MRI electronics including a transmitting and receiving head coil and a spherical phantom.

Meanwhile, to evaluate the performance of the PET detector as the function of the cable length within the MRI, a clinical 3-T MRI as illustrated in FIG. 4 is used.

FIG. 4 is a diagram illustrating a 3-T MRI apparatus including a transmitting and receiving head coil and a spherical phantom. To analyze the effect of the MRI on the PET detector module using the cable of 21 m long, the performance of the PET detector module is measured within the MRI.

The PET detector module is inserted into the MR bore which is disposed between an RF coil and a gradient coil. On the other hand, the components of the PET electronics including the pulse restoration circuit and the front-end preamplifiers are installed outside the MRI room as illustrated in FIG. 5.

Figure 5:
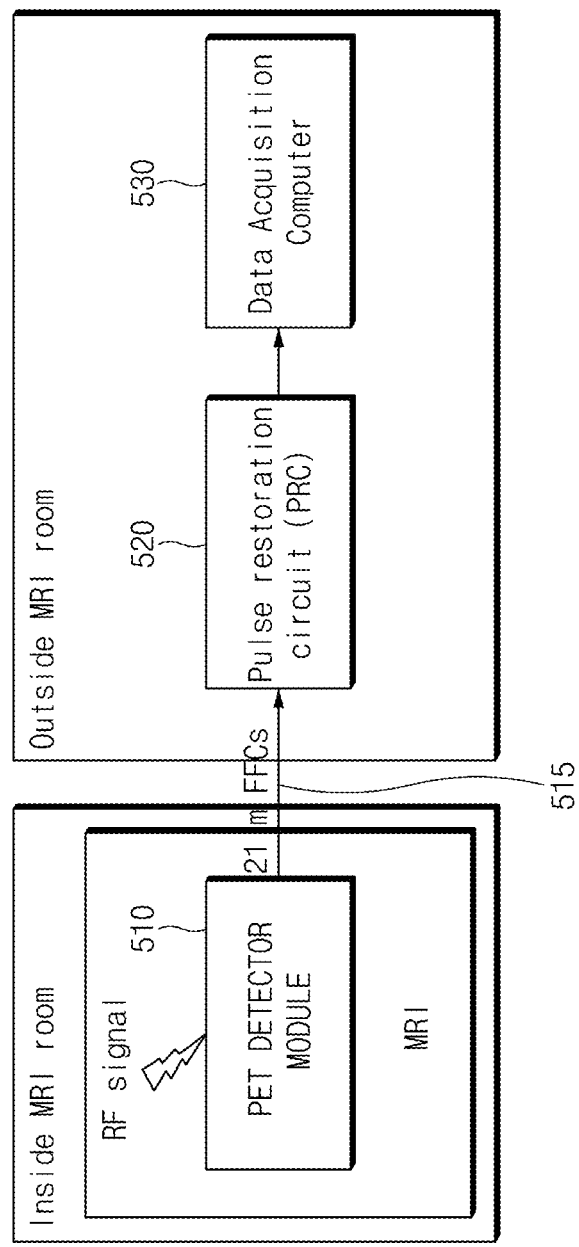
FIG. 5 is a conceptual diagram illustrating components of a PET electronics which are installed outside an MRI room.

FIG. 5 is a conceptual diagram illustrating components of the PET electronics which are installed outside the MRI room.

Referring to FIG. 5, a PET detector module 510 within the MRI room is installed within the MRI and the PET electronics including the pulse restoration circuit (PRC) 520 and a data acquisition computer 530 are installed outside the MRI room. In this case, the photo-sensor signal output from the PET detector module 510 is transmitted to the pulse restoration circuit 520 via the FFCs 515. The PET detector module 510 includes the scintillation crystal and the photo-sensor.

The output signal is restored into an original signal using the pulse restoration circuit 520 to improve a distortion phenomenon of the output signal due to the cable length connected to the PET detector module 510.

In this case, since the PET electronics including the preamplifier is not positioned within the MRI room in the PET-MRI convergence system illustrated in FIG. 5, the reduction in the PET performance due to the magnetic field within the MRI room does not occur. Further, when the PET-MRI convergence system is designed using the pulse restoration circuit 520, there is no need to install the shielding box for protecting the PET electronics from a magnetic field.

Meanwhile, the photopeak position, the energy resolution, and the time resolution on the PET detector 510 are simultaneously acquired with other MR imaging sequences driving the MRI.

The MR imaging sequences are shown in the following Table.

TABLE 1

| MR sequence | Repetition time (TR) | Echo time (TE) | Flip angle (FA) |
|---|---|---|---|
| T2 weighted turbo spin echo (TSE) | 4000 ms | 90 ms | 120 degree |
| Fluid attenuated inversion recovery (FLAIR) | 9040 ms | 83 ms | 150 degree |
| Three dimensional T1 weighted fast low angle shot sequence (FLASH) | 19 ms | 4.92 ms | 25 degree |
| Single shot echo planar imaging sequence (EPI) | 4100 ms | 91 ms | |

A calculation of a signal-to-noise (SNR) ratio and MRI uniformity is made when the PET detector module is present or is not present in an MR imaging field of view (FOV).

The MRI uniformity (%) may be calculated by the following Equation.

$$MRI\ \text{Uniformity}(\%) = 100 \times \left( \frac{ROI_{max} - ROI_{min}}{ROI_{max} + ROI_{min}} \right)$$

In the above Equation, $ROI_{max}$ and $ROI_{min}$ mean a pixel having a highest value and a pixel having a lowest value in a region of interest (ROI).

Signal strength and noise may be obtained by calculating a mean pixel value and a standard error of pixel values in the ROI.

Hereinafter, a pulse form of the PET detector which is measured by using the long cable and the pulse restoration circuit according to the exemplary embodiment of the present disclosure will be described.

Figure 6:
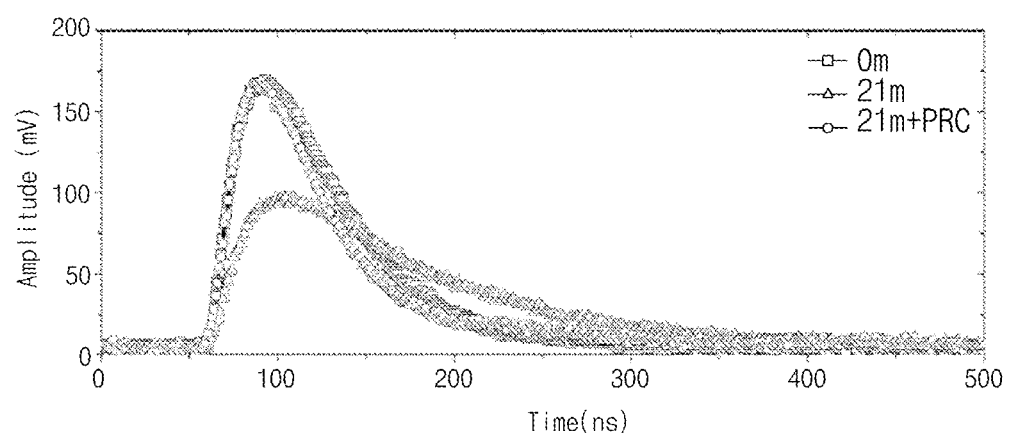
FIG. 6 is a diagram illustrating an output waveform of a PET detector depending on a cable length.

FIG. 6 is a diagram illustrating an output waveform of the PET detector depending on the cable length.

Referring to FIG. 6, in the case of using a 21 m cable, pulse distortions such as a weakened voltage magnitude, a lagged rising time, a long falling time are observed at the output pulse of the PET detector.

The pulse distortions caused by the long cable may be corrected by the pulse restoration circuit and the acquired pulse form is similar to the pulse of the PET detector having a 0 m cable. Referring again to FIG. 6, the output pulse form of the PET detector is illustrated, in which it may be confirmed that an output pulse waveform in the case in which the PET detector has a 0 m cable length is similar to that in the case in which a 21 m cable and the pulse restoration circuit are present.

To understand an effect of different cable lengths on the performance of the PET detector, many experiments are performed and to investigate the compatibility of the PET and the MRI, the performance of the PET detector using the long cable having 21 m long is evaluated outside and inside the MRI by using the pulse restoration circuit.

Hereinafter, the performance of the PET detector as the function of the cable length outside the MRI will be evaluated.

Figure 7A:
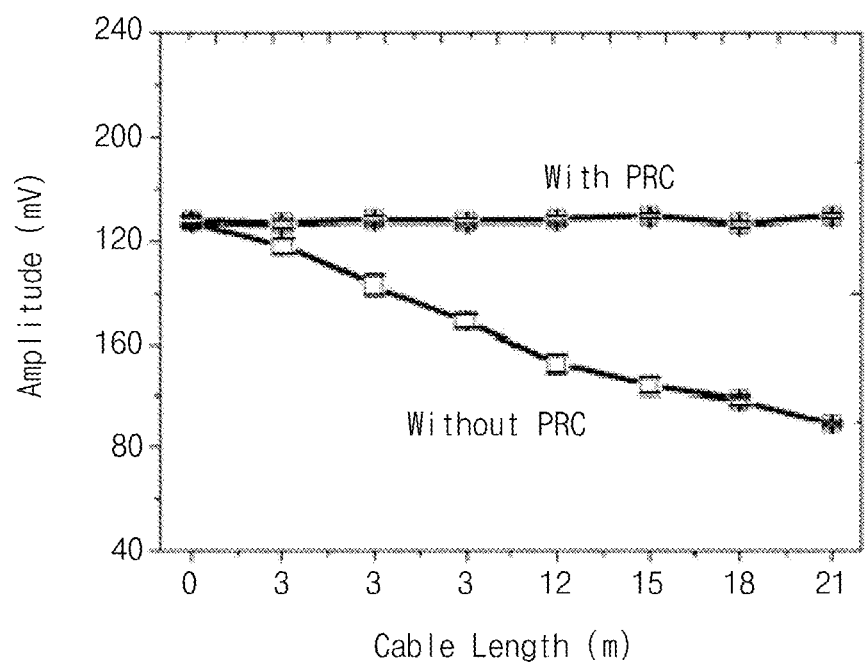
FIGS. 7A and 7B are diagrams illustrating performance of a PET detector as a function of the cable length.
Figure 7B:
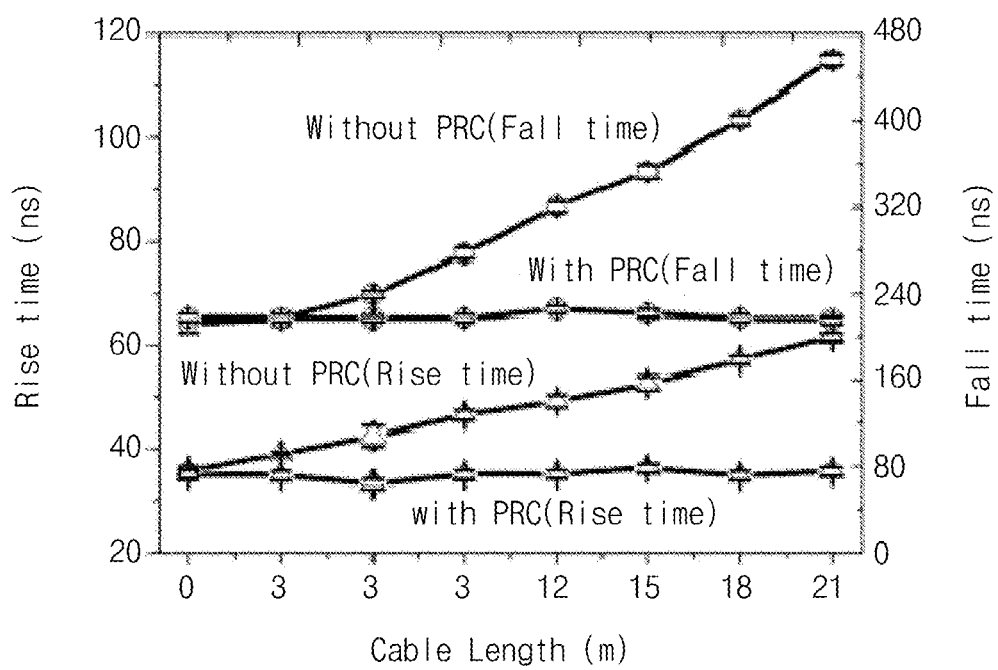

FIGS. 7A to 7C are diagrams illustrating the performance of the PET detector as the function of the cable length.

FIG. 7A illustrates a change in voltage magnitude and FIG. 7B illustrates a change in rising time and falling time. In FIG. 7, □ represents a change in voltage magnitude, ○ represents a change in rising time, and Δ represents a change in falling time.

Referring to FIGS. 7A to 7C, the performance of the PET detector as a function of a length of the FFCs ranging from 0 m to 21 m is considerably changed.

The voltage magnitude is reduced from 170 mV to 100 mV and the rising time and the falling time each are increased from 35 ns to 61 ns and from 210 ns to 450 ns. The reduction in performance may be restored by using the pulse restoration circuit. In this case, the resistance value used in the pulse restoration circuit is changed depending on the cable length.

Figure 8A:
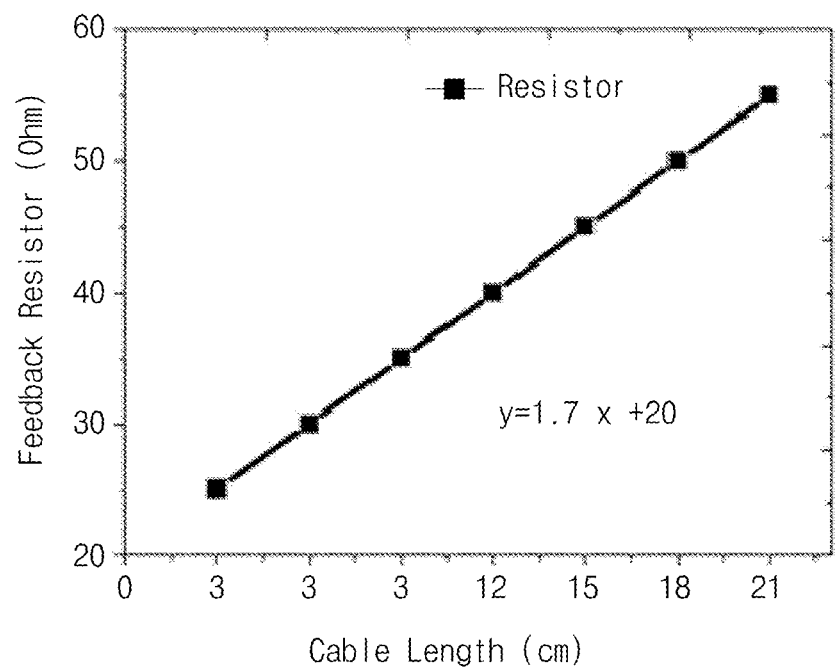
FIGS. 8A and 8B are graphs illustrating values of R2 (feedback resistor) and R5 (low pass filter resistor) which are adjusted depending on the cable length.
Figure 8B:
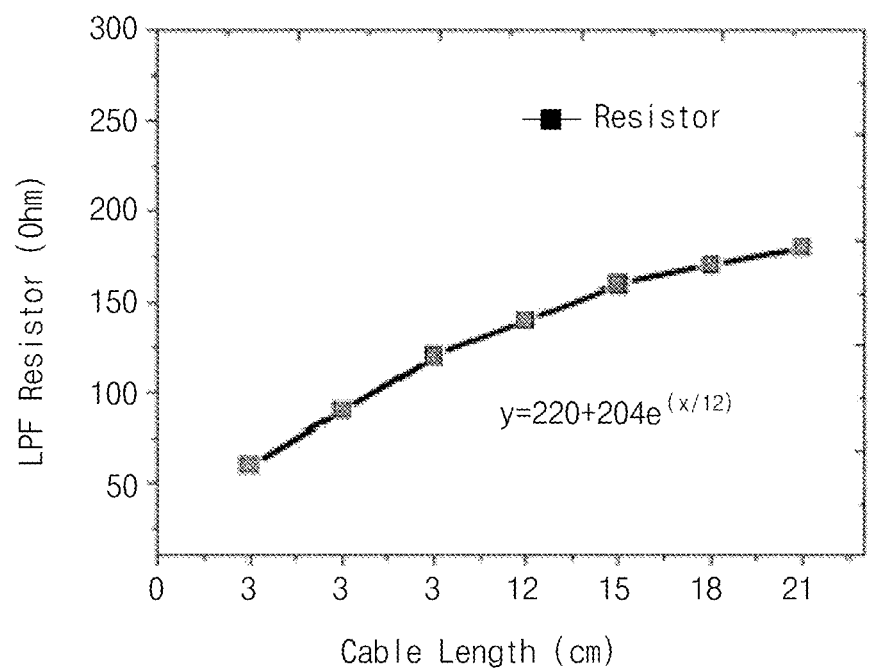

FIGS. 8A and 8B are graphs illustrating values of R2 (feedback resistor) and R5 (low pass filter resistor) which are adjusted depending on the cable length.

As illustrated in FIG. 8A, when the cable length is increased by 3 cm, 6 cm, and 9 cm, the resistance value of the feedback resistor is adjusted to 25Ω, 30Ω, and 35Ω and thus the cable length and the size of the resistance value of the feedback resistor are adjusted to be in direct proportion with each other.

Further, as illustrated in FIG. 8B, when the cable length is gradually increased by 3 cm, 6 cm, and 9 cm, the resistance value of the low pass filter is adjusted to 50Ω, 80Ω, and 125Ω and thus the cable length and the size of the resistance value of the low pass filter are adjusted to be in a log form.

Figure 9A:
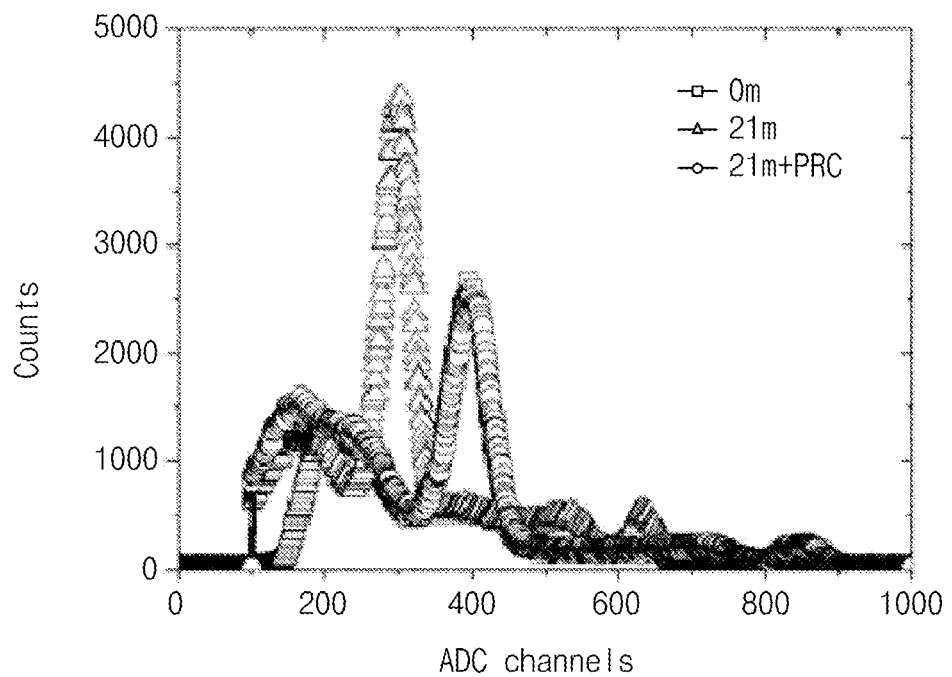
FIGS. 9A and 9B are diagrams illustrating an energy spectrum a and a time spectrum b of the PET detector when a 0 m cable (□), a 21 m cable (Δ) in the case in which no pulse restoration circuit is present, and a 21 m cable (○) in the case in which pulse restoration circuit is present are used.
Figure 9B:
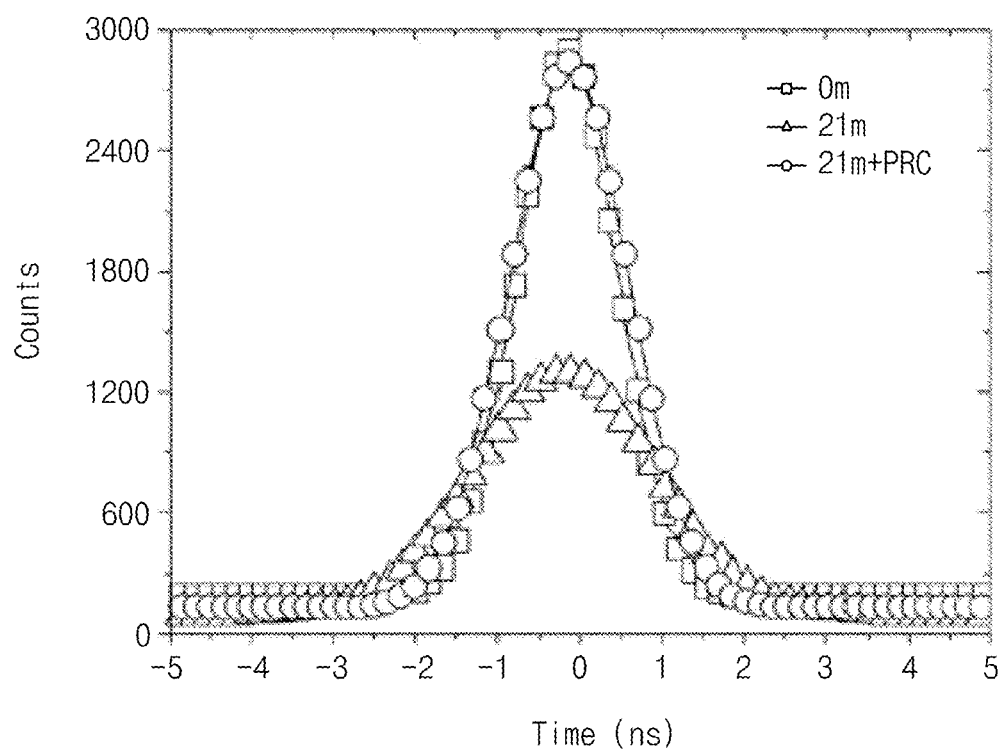

FIGS. 9A and 9B are diagrams illustrating an energy spectrum a and a time spectrum b of the PET detector when a 0 m cable (□), a 21 m cable (Δ) in the case in which no pulse restoration circuit is present, and a 21 m cable (○) in the case in which pulse restoration circuit is present are used.

In the case of using the 21 m cable, the photopeak position of 511 keV is reduced from 400 ch to 300 ch and the time resolution aggravates from 1.1 ns to 2.2 ns.

It may be appreciated that the reduction in performance such as the photopeak position of 511 keV, the energy resolution, and the time resolution is restored by using the pulse restoration circuit according to the exemplary embodiment of the present disclosure, based on the fact that the energy spectrum and the time spectrum at the time of using the 21 m cable of FIG. 9 and the pulse restoration circuit are substantially similar to those at the time of using the 0 m cable.

Figure 10A:
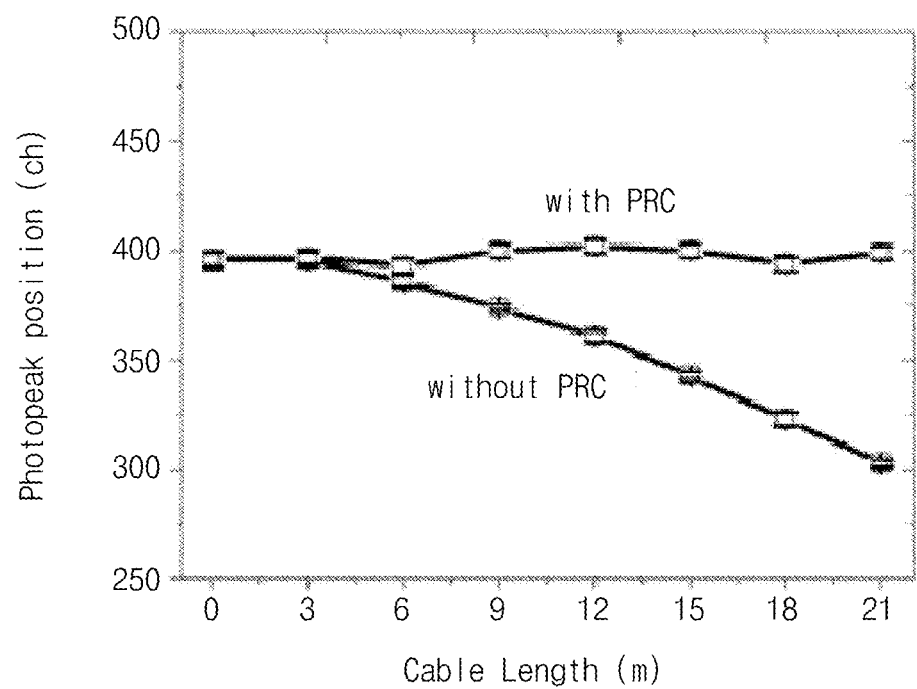
FIGS. 10A to 10C are diagrams illustrating an effect of the cable length on the performance of the PET detector in the case in which the pulse restoration circuit according to the exemplary embodiment of the present disclosure is provided and in the case in which the pulse restoration circuit according to the exemplary embodiment of the present disclosure is not provided.
Figure 10B:
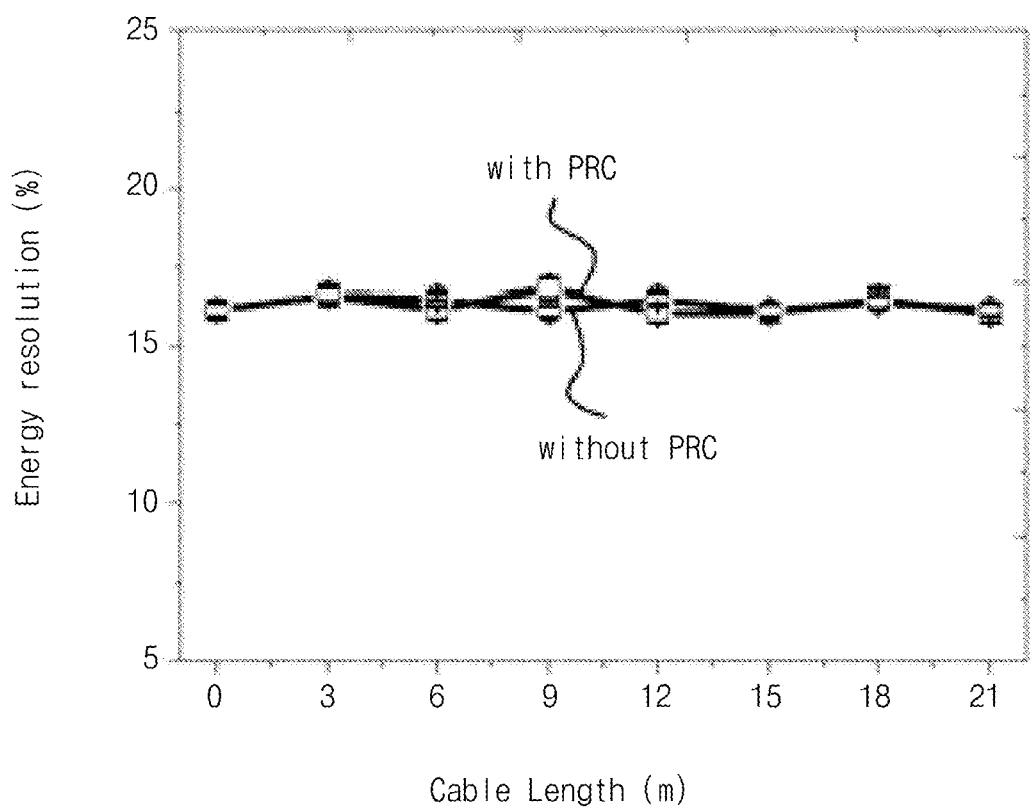
Figure 10C:
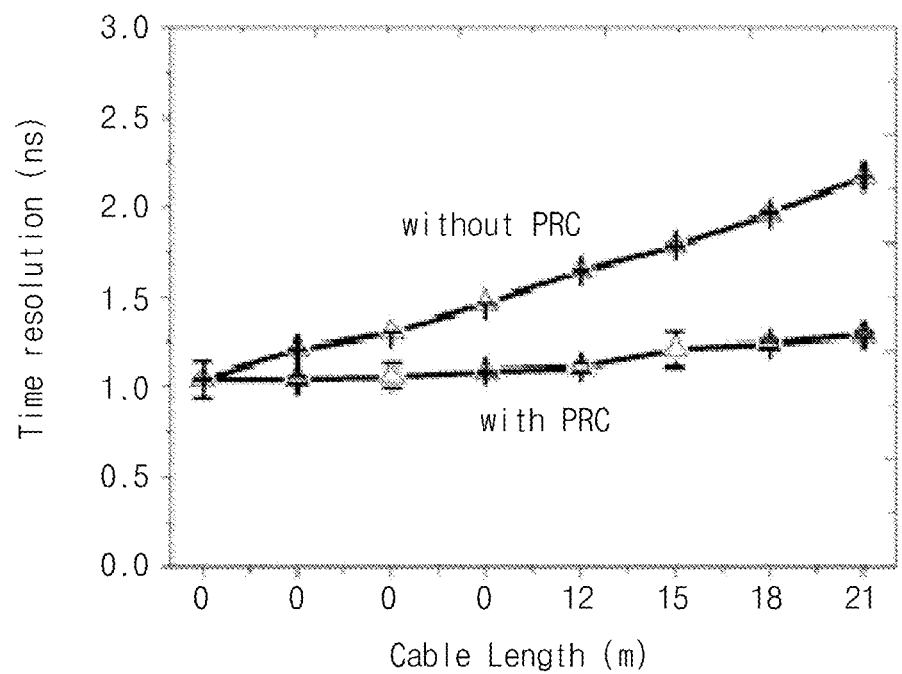

FIGS. 10A to 10C are diagrams illustrating an effect of the cable length on the performance of the PET detector in the case in which the pulse restoration circuit according to the exemplary embodiment of the present disclosure is provided and in the case in which the pulse restoration circuit according to the exemplary embodiment of the present disclosure is not provided.

Referring to FIG. 10A, the photopeak position is restored from 300 ch to 400 ch and referring to FIG. 9C, the time resolution is restored from 2.2 ns to 1.3 ns.

Referring to FIG. 10B, as the function of the cable length, a change is not almost observed in the energy resolution of 16%. However, the performance of the photopeak position and the time resolution of the PET detector is reduced as the function of the FFCs ranging from 0 m to 21 m.

That is, the photopeak position is reduced from 400 ch to 300 ch and the performance of the time resolution is reduced from 1.1 ns to 2.2 ns. The reduction in performance may be corrected by using the pulse restoration circuit.

Hereinafter, the performance of the PET detector as the function of the cable length inside the MRI will be evaluated.

Figure 11A:
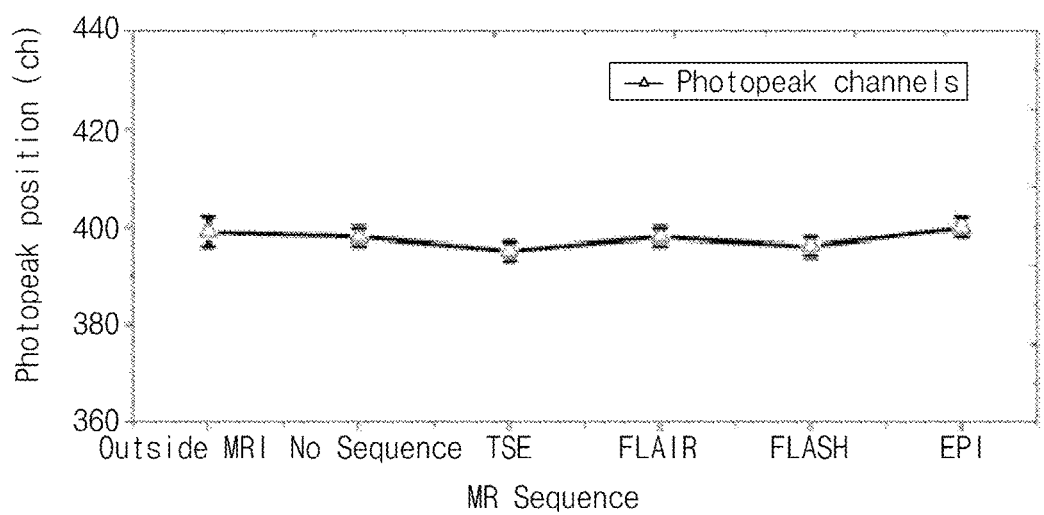
FIGS. 11A to 11C are diagrams illustrating a change in photopeak position a, energy resolution b, and time resolution c of the PET detector module depending on various MR sequences.
Figure 11B:
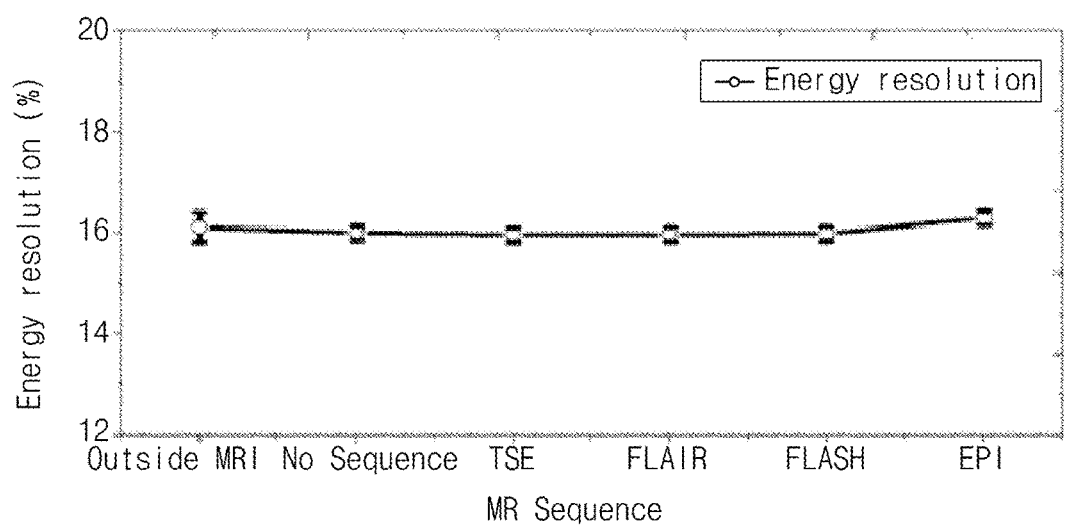
Figure 11C:
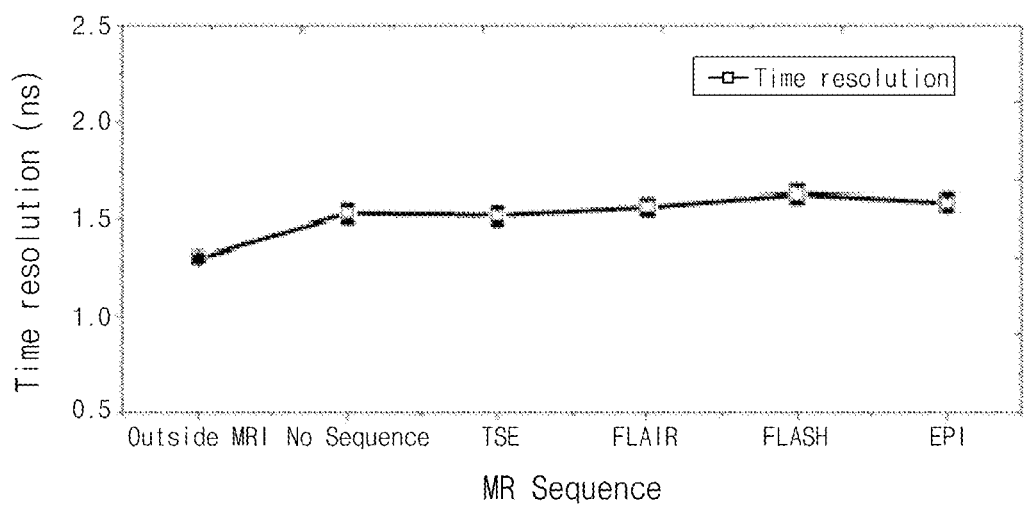

FIGS. 11A to 11C are diagrams illustrating a change in photopeak position a, energy resolution b, and time resolution c of the PET detector module depending on various MR sequences.

FIGS. 11A to 11C illustrate that the performance of the PET detector such as the energy resolution, the time resolution, and the photopeak position is not reduced independent of the MR sequence.

In this case, it may be appreciated that the photopeak position, the energy resolution, and the time resolution of the PET detector module depending on various MR sequences are 400 ch, 16%, and 1.4 ns.

As described above, the exemplary embodiment of the present disclosure relates to the pulse restoration circuit which uses the long cable arriving from the GAPD photo-sensor to the PET electronics to compensate for the reduction in performance of the PET detector signal due to the use of the long cable arriving from the GAPD photo-sensor to the PET electronics.

As the investigation result of Six parameters in the performance of the PET detector, that is, the pulse size, the rising time, the falling time, the photopeak position, the energy resolution, and the time resolution when the pulse restoration circuit is used or is not used inside and outside the MRI, the pulse form measured by the pulse restoration circuit and the PET detector using the long cable is similar to the pulse form measured by the 0 m cable length.

Further, the performance of the PET detector is similar outside and inside the MR environment. That is, even though the PET detector is inserted into the RF coil and the gradient coil to simultaneously obtain the PET and MRI data, the mutual interference is not observed.

According to the exemplary embodiment of the present disclosure, it may be shown that the pulse restoration circuit may improve the reduction in performance of the pulse form, the energy resolution, the time resolution, the photopeak position, and the like due to the use of the long cable. Further, according to the exemplary embodiment of the present disclosure, the components of the PET electronics may be installed outside the space in which the MRI is disposed by using the 21 m cable and the installation may increase the compatibility of the PET-MRI.

As described above, according to the exemplary embodiments of the present disclosure, it is possible to improve the reduction in performance of the medical image electronics, in particular, improve the reduction in performance of the PET detector among the medical image electronics, by correcting the distortion of the output signal depending on the cable length into the original signal using the pulse restoration circuit. Further, according to the exemplary embodiments of the present disclosure, it is possible to prevent the PET performance from reducing due to the magnetic field within the MRI room since the PET electronics including the preamplifier is not positioned within the MRI room in the PET-MRI convergence system. In addition, according to the exemplary embodiments of the present disclosure, it is possible to reduce costs since the shielding box for protecting the PET electronics from the magnetic field is not required to install at the time of designing the PET-MRI convergence system using the pulse restoration circuit.

As described above, the present disclosure is described with reference to specific matters such as the detailed components, the limited exemplary embodiments, and the drawings, but is provided to help a general understanding of the present disclosure. Therefore, the present disclosure is not limited to the above exemplary embodiments and can be variously changed and modified from the description by a person skilled in the art to which the present disclosure pertains. Therefore, the spirit of the present disclosure should not be limited to these exemplary embodiments, but the claims to be described below and all of modifications equal or equivalent to the claims are intended to fall within the scope and spirit of the present disclosure.

What is claimed is:

1. A pulse restoration circuit, comprising:
   a voltage restorator configured to include an OP amplifier and input an input voltage to an input terminal of the OP amplifier;
   a rising time restorator configured to be connected to the other input terminal of the OP amplifier; and
   a falling time restorator configured to be connected to an output terminal of the OP amplifier, wherein an original signal is restored by the pulse restoration circuit depending on a cable length.

2. The pulse restoration circuit according to claim 1, wherein the voltage restorator includes:
   an input resistor configured to be connected to the input terminal of the OP amplifier;
   an amplification terminal resistor connected to the rising time restorator in parallel configured to be connected to the other input terminal of the OP amplifier; and a feedback resistor configured to be connected between the other input terminal of the OP amplifier and the output terminal of the OP amplifier.

3. The pulse restoration circuit according to claim 1, wherein in the rising time restorator, a high pass filter resistor and a high pass filter capacitor are connected in series between the other input terminal of the OP amplifier and a ground.

4. The pulse restoration circuit according to claim 1, wherein in the falling time restorator, the output terminal of the OP amplifier is connected to one terminal of a low pass filter resistor, a low pass filter capacitor is connected to the other terminal of the low pass filter resistor and a ground, one terminal of an output resistor is connected to the other terminal of the low pass filter resistor, and a corrected output voltage is output to the other terminal of the output resistor.

5. The pulse restoration circuit according to claim 1, wherein an original signal is restored by adjusting a resistance value of the pulse restoration circuit depending on a cable length.

6. The pulse restoration circuit according to claim 5, wherein the adjustment of the resistance value adjusts a value of a feedback resistor of the voltage restorator or a resistance value of a low pass filter of the falling time restorator.

* * * * *